US006924178B2

United States Patent
Beintner

(10) Patent No.: US 6,924,178 B2
(45) Date of Patent: Aug. 2, 2005

(54) OXIDE/NITRIDE STACKED IN FINFET SPACER PROCESS

(75) Inventor: Jochen C. Beintner, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/730,582

(22) Filed: Dec. 8, 2003

(65) Prior Publication Data

US 2005/0124101 A1 Jun. 9, 2005

(51) Int. Cl.[7] .................... H01L 21/336; H01L 21/84; H01L 21/00
(52) U.S. Cl. .................... 438/157; 438/283; 438/286; 438/149
(58) Field of Search ................ 438/157, 283, 438/286, 149, 291

(56) References Cited

U.S. PATENT DOCUMENTS

| | | | | |
|---|---|---|---|---|
| 6,413,802 B1 | * | 7/2002 | Hu et al. ................... 438/151 |
| 6,492,212 B1 | * | 12/2002 | Ieong et al. ............... 438/157 |
| 6,657,252 B2 | * | 12/2003 | Fried et al. ................ 257/316 |
| 6,720,619 B1 | * | 4/2004 | Chen et al. ................. 257/347 |
| 6,765,303 B1 | * | 7/2004 | Krivokapic et al. ......... 257/25 |
| 6,768,158 B2 | * | 7/2004 | Lee et al. ................... 257/315 |
| 6,787,406 B1 | * | 9/2004 | Hill et al. .................. 438/164 |
| 6,787,476 B1 | * | 9/2004 | Dakshina-Murthy et al. ... 438/740 |
| 6,794,718 B2 | * | 9/2004 | Nowak et al. .............. 438/149 |
| 6,800,905 B2 | * | 10/2004 | Fried et al. ................ 257/351 |
| 6,800,910 B2 | * | 10/2004 | Lin et al. ................... 257/410 |
| 6,803,631 B2 | * | 10/2004 | Dakshina-Murthy et al. ... 257/349 |
| 6,812,075 B2 | * | 11/2004 | Fried et al. ................ 438/157 |

* cited by examiner

Primary Examiner—John F. Niebling
Assistant Examiner—Walter L. Lindsay Jr.
(74) Attorney, Agent, or Firm—W. Y. Cheung; E. W. Petraske

(57) ABSTRACT

In a FinFET integrated circuit, the fins are formed with a body thickness in the body area and then thickened in the source/drain area outside the body to improve conductivity. The thickening is performed with epitaxial deposition while the gates are covered by a composite gate cover layer to prevent thickening of the gates, which may short the gate to the source/drain.

24 Claims, 12 Drawing Sheets

OXIDE/NITRIDE STACKED IN FINFET SPACER PROCESS

TECHNICAL FIELD

The field of the invention is that of fabricating field effect transistors having a body extending perpendicular to the semiconductor substrate between horizontally disposed source and drain regions, referred to as a "FinFET".

BACKGROUND OF THE INVENTION

Metal-Oxide-Semiconductor field effect transistor (MOSFET) technology is the dominant electronic device technology in use today. Performance enhancement between generations of devices is generally achieved by reducing the size of the device, resulting in an enhancement in device speed. This is generally referred to as device "scaling".

Ultra-large-scale integrated (ULSI) circuits generally include a multitude of transistors, such as more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. The transistors can be N-channel MOSFETs or P-channel MOSFETs.

In bulk semiconductor-type devices, transistors such as MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

As MOSFETs are scaled to channel lengths below 100 nm, conventional MOSFETs suffer from several problems. In particular, interactions between the source and drain of the MOSFET degrade the ability of the gate to control whether the device is on or off. This phenomenon is called the "short-channel effect".

Silicon-on-insulator (SOI) MOSFETs are formed with an insulator (usually, but not limited to, silicon dioxide) below the device active region, unlike conventional "bulk" MOSFETs, which are formed directly on silicon substrates, and hence have silicon below the active region.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variations in small size transistors), near-ideal subthreshold voltage swing (i.e., good for low off-state current leakage), and high saturation current. SOI is advantageous since it reduces unwanted coupling between the source and the drain of the MOSFET through the region below the channel. This is often achieved by ensuring that all the silicon in the MOSFET channel region can be either inverted or depleted by the gate (called a fully depleted SOI MOSFET). As device size is scaled, however, this become increasingly difficult, since the distance between the source and drain is reduced, and hence, they increasingly interact with the channel, reducing gate control and increasing short channel effects (SCE). The double-gate MOSFET structure is promising since it places a second gate in the device, such that there is a gate on either side of the channel. This allows gate control of the channel from both sides, reducing SCE. Additionally, when the device is turned on using both gates, two conduction ("inversion") layers are formed, allowing for more current flow. An extension of the double-gate concept is the "surround-gate" or "wraparound-gate" concept, where the gate is placed such that it completely or almost-completely surrounds the channel, providing between gate control.

In a double gate field effect transistor (FinFET), the device channel comprises a thin silicon fin standing on an insulative layer (e.g. silicon oxide) with the gate in contact with the sites of the fin. Thus inversion layers are formed on the sides of the channel with the channel film being sufficiently thin such that the two gates control the entire channel film and limit modulation of channel conductivity by the source and drain.

The double gates on the channel fin effectively suppress SCE and enhance drive current. Further, since the fins is thin, doping of the fin is not required to suppress SCE and undoped silicon can be used as the device channel, thereby reducing mobility degradation due to impurity scattering. Further, threshold voltage of the device may be controlled by adjusting the work function of the gate by using a silicon-germanium alloy or a refractory metal or its compound such as titanium nitride.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Heretofore, lithographic tools are utilized to form transistors and other structures on the integrated circuit. For example, lithographic tools can be utilized to define gate conductors, active lines conductive lines, vias, doped regions, and other structures associated with an integrated circuit. Most conventional lithographic fabrication processes have only been able to define structures or regions having a dimensions of 100 nm or greater.

In one type of conventional lithographic fabrication process, a photoresist mask is coated over a substrate or a layer above the substrate. The photoresist mask is lithographically patterned by providing electromagnetic radiation, such as ultraviolet light, through an overlay mask. The portions of the photoresist mask exposed to the electromagnetic radiation react (e.g. are cured). The uncured portions of the photoresist mask are removed, thereby transposing the pattern associated with the overlay to the photoresist mask. The patterned photoresist mask is utilized to etch other mask layers or structures. The etched mask layer and structures, in turn, can be used to define doping regions, other structures, vias, lines, etc.

As the dimensions of structures or features on the integrated circuit reach levels below 100 nm or 50 nm, lithographic techniques are unable to precisely and accurately defined the feature. For example, as described above, reduction of the width of the gate conductor (the gate length) associated with a transistor or of the active lines associated with an SOI transistor has significant beneficial effects. Future designs of transistors may require that the active lines have a width of less than 50 nanometers.

Double gate SOI MOSFETs have received significant attention because of its advantages related to high drive current and high immunity to short channel effects. The double-gate MOSFET as able to increase the drive current because the gate surrounds the active region by more than one layer (e.g., the effective gate total width is increased due to the double gate structure). However, patterning narrow, dense active regions is challenging. As discussed above with respect to gate conductors, conventional lithographic tools are unable to accurately and precisely define active regions as structures or features with dimensions below 100 nm or 50 nm.

Thus, there is a need for an integrated circuit or electronic device that includes smaller, more densely disposed active regions or active lines. Further still, there is a need for a ULSI circuit which does not utilize conventional lithographic techniques to define active regions or active lines.

Even further still, there is a need for a non-lithographic approach for defining active regions or active lines having at least one topographic dimension less than 100 nanometers and less than 50 nanometers (e.g., 20–50 nm). Yet further still, there is a need for an SOI integrated circuit with transistors having multiple sided gate conductors associated with active lines having a width of about 20 to 50 nm.

The present invention is directed to a process for fabricating FinFET transistor structures which is an extension of conventional planar MOSFET technology and resulting structures.

SUMMARY OF THE INVENTION

The present invention is directed to a process for fabricating FinFET transistor structures, in which the fins in the Source/Drain (S/D) area are increased in thickness by epitaxial silicon growth while the transistor bodies under the gates remain at the design value.

A feature of the invention is the use of a gate spacer process that enables the formation of an encapsulated gate while the sidewall of the fins is cleared and thickened.

A feature of the invention is that a conformal layer of a material resistant to an oxide etch is formed on the gates to protect the gates while the S/D area of the fins is cleaned of oxide.

Another feature of the invention is the anisotropic etch of a layer of oxide on the lower portion of the gates, leaving an oxide spacer that is not removed during the removal of oxide on the fins.

DETAILED DESCRIPTION

This invention describes a process to fabricate FinFET transistors using a gate spacer process that enables the formation of an encapsulated gate while the sidewall of the fins is cleared. Clearing the fin sidewall from unwanted spacer material but still keeping a cap on top and spacer material on the side of the gate is quite difficult as a long overetch of the gate spacer is required. This overetch that clears the sidewall of the fins also consumes the cap on top of the gate and the spacer on the side of the gate, increasing the possibility of exposing polysilicon from the gate. Cleared fin sidewalls are necessary to increase the fin thickness outside of the gate to reduce series resistance. If polysilicon from the gate is exposed, epitaxial growth will also occur on the gate. The uncontrolled epitaxial growth on the gate can cause shorting of gate and source/drain during silicidation. It also can result in unwanted shadowing of later ion implants.

Figure 1A:
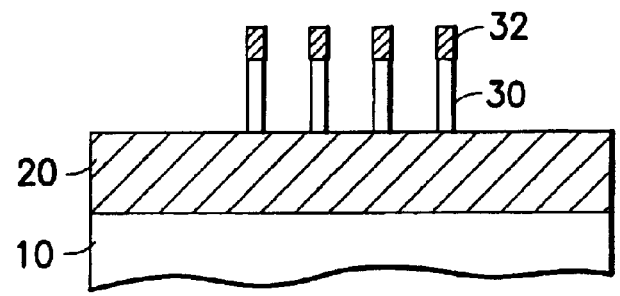
FIG. 1 shows in cross section a preliminary step in the process of forming the invention, showing fins formed before the gate formation.
Figure 1B:
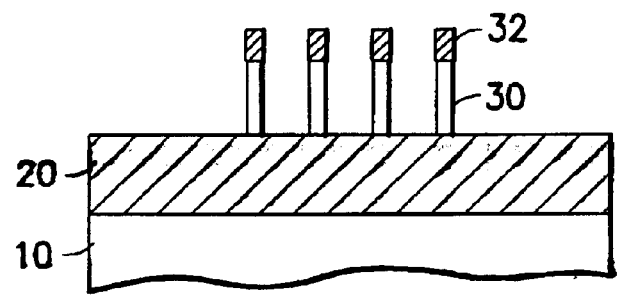
Figure 1C:
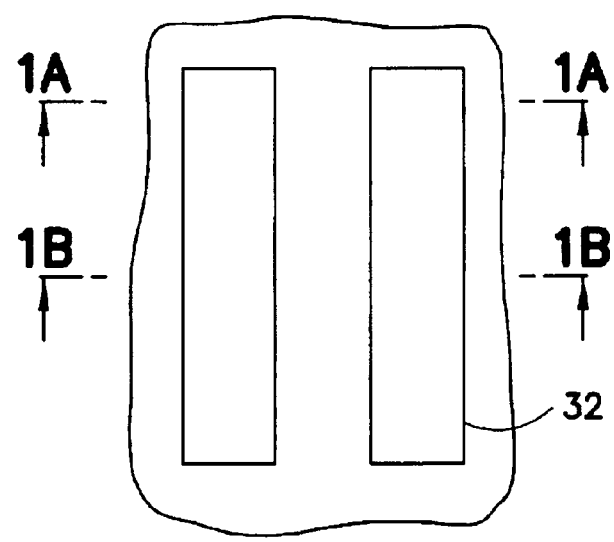

Referring now to FIG. 1, there is shown in cross section a portion of an integrated circuit that will contain a set of FinFET transistors. Wafer 10 may be bulk silicon or an SOI wafer. The SOI wafer is preferred and is illustrated here. Above substrate 10, buried oxide insulator (BOX) layer 20 has been formed by conventional processes. Sitting on top of BOX 20 are blocks of silicon 30 (capped with oxide 32) extending perpendicular to the plane of the paper that will form the fins of FinFETs. The plane of the cross section in FIG. 1A is taken through the S/D area and in FIG. 1B through the location where transistor gates will be placed in later steps. FIG. 1C is a top view showing the location of cross sections 1A and 1B. Rectangles 32 are the top views of the fins in FIGS. 1A and 1B. Only two of the four fins 30 are shown for economy. The horizontal dimensions appearing in the cross section will be referred to as transverse dimensions. For convenience in explanation, the top of FIG. 1C will be referred to as North, with other directions corresponding. Thus, FIG. 1A is a cross section taken at the North end of the fins, looking north.

Blanket implants may be done at any convenient time.

Illustrative ranges for the SOI silicon layer thickness that is formed into blocks 30 are 1000 Å to 2000 Å. A thermal oxide 32 is grown to a thickness of 300 Å (ranging between 30 Å–1000 Å) on the surface of the silicon using thermal diffusion processes. Alternatively the oxide can be deposited with the same thickness using CVD processes.

In this example, a set of four fins shown will be controlled by a common gate. Those skilled in the art will be aware that separated gates could be formed to control one or more fins, if desired. As used herein, the term "set" means one or more; i.e. a FinFET may have one or more fins. The Figure shows the result of conventional preliminary steps, well known to those skilled in the art, of forming the silicon fins for a FinFET.

Narrow fin structures in silicon or silicon on insulator (SOI) can be fabricated in different ways, e.g. by optical lithography followed by different trimming techniques (resist trimming, hard mark trimming, oxidation trimming (These processes are based on width reduction of the mask by plasma etch or wet etch, or by material consumption of the fin by oxidation)), by E-beam lithography or by sidewall image transfer processes.

In the example illustrated, the sidewall image transfer process was used as the method to structure narrow fins in SOI. FIG. 1 shows a bulk wafer 10, having a buried oxide (BOX) 20 with an SOI layer 30 of 70 nm (Possible range of the SOI is ~10 nm to 200 nm, but not limited to that range). The surface of layer 30 has been oxidized to form 300 Å of thermal oxide 32 (Preferred range 50 Å–500 Å). Alternatively, an oxide can also be deposited using any kind of CVD processes.

The following discussion illustrates a conventional method, well known to those skilled in the art, of fabricating the structure shown in FIG. 1. Other methods may also be used. These initial steps are not illustrated in the Figures to avoid unnecessary detail. Initially, 1500 Å (Preferred range 500 Å–3000 Å) of temporary amorphous silicon (not shown) were deposited on the wafer surface that will be formed into the fins (oxide layer 32 on top of fin layer 30) by CVD or sputter processes, followed by the deposition of 500 Å (Preferred range 100 Å–2000 Å) of CVD oxide (not shown) as a hardmask. Optical lithograpy and RIE etch processes are used to structure the CVD oxide hardmask and, using the CVD oxide hardmask, the amorphous silicon layer, stopping on the oxide layer 32 on top of the SOI to form a temporary structure that supports the conformal layer that follows. Then a 200 Å (Preferred range 50 Å–500 Å) nitride layer (not shown) is deposited conformally using a CVD process followed by a RIE etch process to form SiN spacers (sidewalls) on the side of the amorphous silicon.

The amorphous silicon is then removed with a plasma etch or wet etch leaving nitride spacer structures behind. The spacer structures are used as a hardmask to structure the oxide 32 underneath and can be removed afterwards by oxide and silicon selective plasma etches or wet etches (e.g. hot phosphoric acid). The structured oxide 32 is then used as a hardmask to etch the silicon fins 30 in the SOI layer, resulting in the example shown in FIG. 1. Next, a sacrificial oxide is thermally grown to remove RIE damage from the silicon fin surface and to act as a screen oxide for fin body doping implants that can be processed at this point. Fin body doping implants are not necessary to make the FinFET device work, but can be useful to set FinFET Vt.

The sacrificial oxide is removed by a wet etch, following by a preclean and gate oxide processing using thermal oxidation or CVD deposition processes. A specific example of the process described above is shown in copending patent application Attorney Docket Number YOR920030433US1, assigned to the assignee hereof and incorporated herein by reference and omitted from this description for simplicity.

Figure 2A:
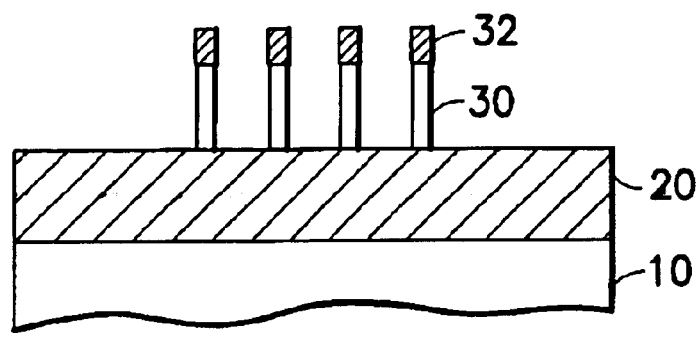
FIG. 2A shows the fins in the S/D area.
Figure 2B:
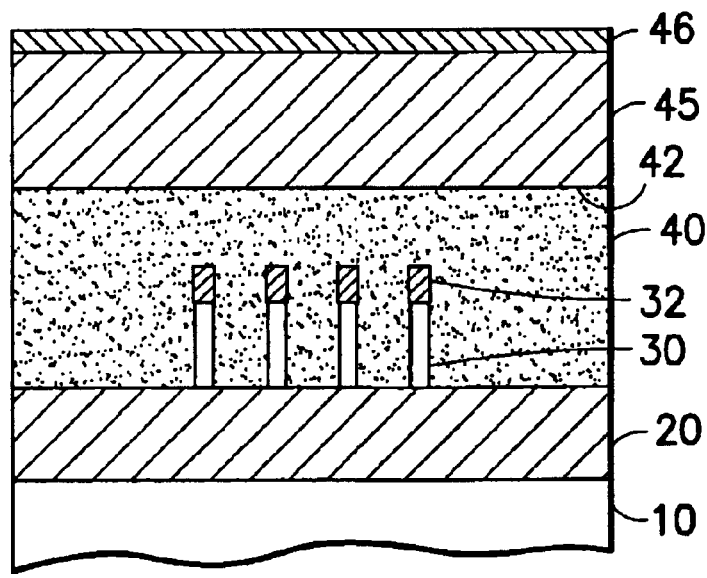
FIG. 2B shows a cross section through the gate.
Figure 2C:
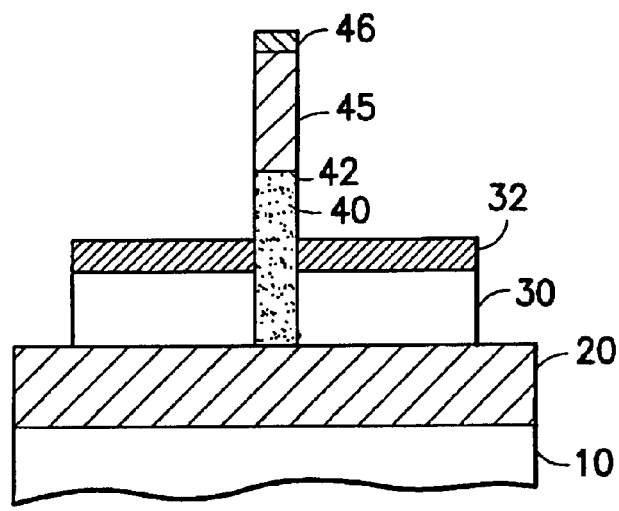
FIG. 2C shows a cross section through the gate looking perpendicular to the fin.

Referring now to FIGS. 2B and 2C, a polysilicon layer 40 of 1300 Å (Preferred range 300 Å–3000 Å, depending on total fin height) is deposited using a CVD process and then planarized by a CMP or planarizing coating/etchback processes to improve the process window of the gate lithography step later in the process. Optional poly pre-doping to adjust the gate work function for NFETs and PFETs is followed by a low temperature CVD deposition of 400 Å nitride 45 that forms a protective cap.

As explained below, the total height of a hardmask formed by layer 45 needs to be greater than silicon fin 30 height plus the oxide 32 on fin plus a process margin. Before the nitride deposition, an optional oxide layer 42 (Preferred range 20 Å–500 Å) can be deposited to act as stress buffer between the nitride and the polysilicon. For convenience in the illustration, layer 42 is shown as a single line. On top of the nitride 45 another hardmask layer 46 is deposited, e.g., CVD oxide, with a thickness of 1000 Å (Preferred Range 100 Å–2000 Å. The complete hardmask stack (e.g. oxide on nitride on oxide on polysilicon) is patterned lithographically to remove oxide 46 outside rectangle 45 in FIG. 2D. Oxide 46 within rectangle 45 then serves as a hardmask during the etching of nitride 45, oxide 42 and poly 40. Oxide layer 46 is shown in FIGS. 2B and 2C after the nitride and polysilicon etch, so that most of it has been consumed.

Figure 2D:
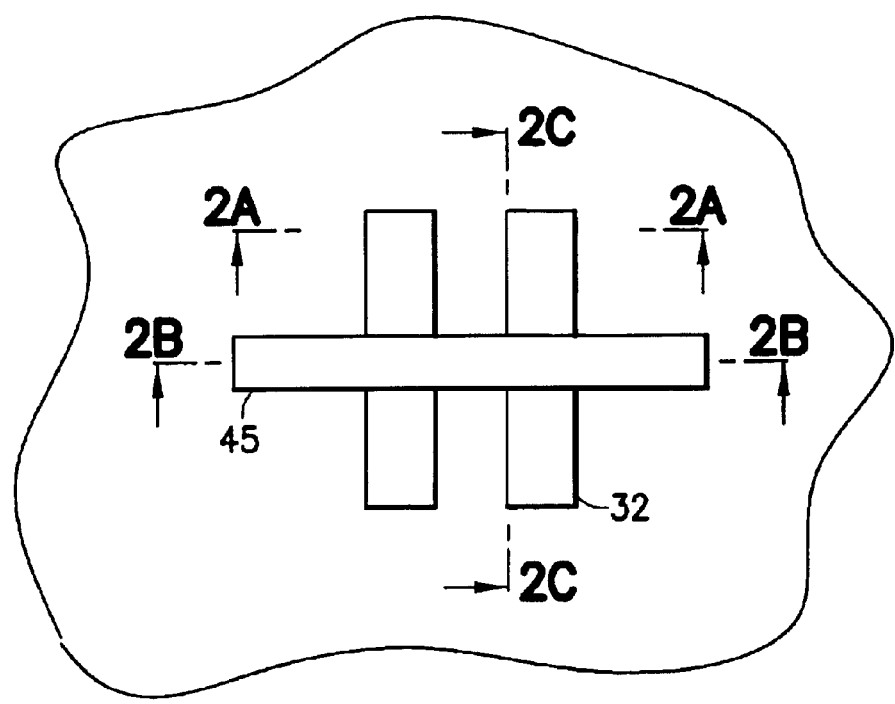
FIG. 2D is a top view showing the location of the other Figures.
Figure 3A:
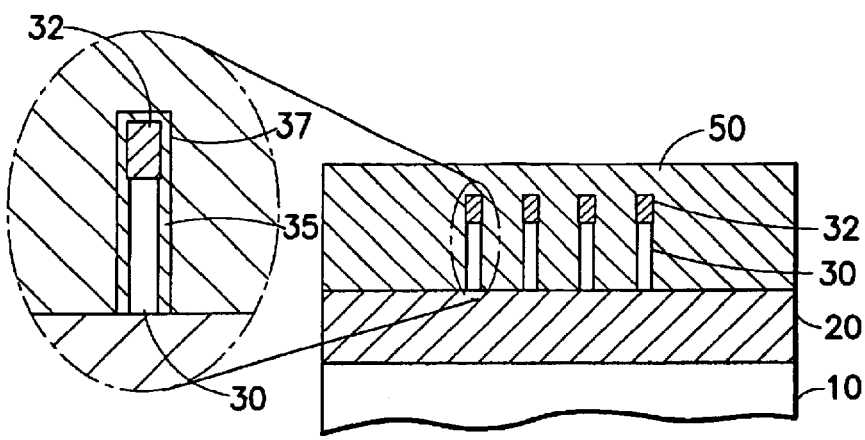
FIG. 3A shows the S/D area after an optional step to add a liner on the fins and the deposition of an oxide filler.
Figure 3B:
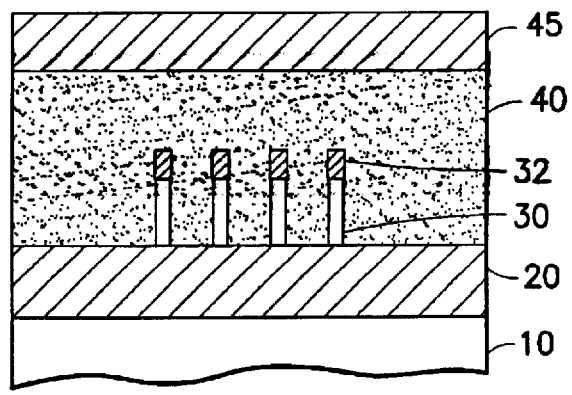
FIG. 3B shows the same area as FIG. 2B.

FIG. 2D is the same as FIG. 1C with the addition of rectangle 45, which represents the vertical pillar in FIG. 2C. Rectangle 45 defines the gate for the FinFET. The sources and drains are the portions of the fins (vertical rectangles) in FIG. 2D outside rectangle 45. In FIG. 3 and the following figures, Figures n-A, n-B and n-C will have the same orientation as FIGS. 2A, 2B and 2C, respectively.

The Nitride 45 has been structured as described above using optical lithography (the area shown as box 45 in FIG. 2D), e-beam lithography or side wall image transfer processes, and RIE to form a hardmask. Using the hardmark, a poly etch forms structure 40 extending E-W that will become the selfaligned gate. The result of the lithographic step forming the poly gate is that FIG. 2A shows the same view as FIG. 1A in the S/D region, while FIG. 2B shows the poly structure capped by a nitride hardmask. FIG. 2C shows a view looking E along the poly structure.

The fin 30 extends horizontally in FIG. 2C and the gate 40 extends perpendicular to the plane of the paper, with the plane of the cross section within the poly structure and outside the fin. If a gate width having a sub-lithographic dimension is desired, trimming of the nitride hardmask 45 on top of the polysilicon can be done by resist trimming techniques or by nitride wet etch or dry etch processes. The nitride hardmask is then used to structure the polysilicon by RIE, forming gate conductor of the FinFET.

The length of the transistor body along the fin is set by the width of gate 40 along the N-S direction (the left-right distance in FIG. 2C). As described below, it is desirable to increase the thickness (the E-W dimension) of the fins 30 in the S/D (FIG. 2A) compared with the corresponding body width in FIG. 2B; i.e. The final width of fins 30 in the S/D region outside rectangle 45 will be greater than the width shown in FIG. 2A. The bulk of the steps in this process are directed at protecting the gates 40 during the step of thickening the S/D.

The remaining portion of the inventive process involves increasing the thickness of the fins in the S/D area to provide lower resistance. Along with that, a protective sidewall is formed over the gate that prevents the gate form being thickened (which would change the dimension of the transistor body and possibly short the body to the source or drain) and also defining the area of the FinFET that is the transition between the body and the S/D that corresponds to the LDD region in a planar transistor.

The next steps in preparation for the S/D thickening are a 30 Å gate sidewall oxidation (Preferred range 0 Å–100 Å, 0 Å meaning, that this step can also be omitted), 30 Å CVD oxide liner deposition (Preferred range 0 Å–300 Å, 0 Å meanings, that this step can also be omitted) and implantations to process halo and extension implants. It should be mentioned that this is not a fixed sequence, e.g., the NFET halo and extension implants can be done after gate sidewall oxidation, the PFET halo and extension implants after the oxide linear deposition. The halo and extension implants are conventional, well known to those skilled in the art. Optionally a CVD nitride liner 37 can be deposited with a thickness of 100 Å (Preferred range 30 Å–300 Å) as shown in FIG. 3A. The nitride liner 37 acts as a protection layer during a later oxide etch to prevent oxide removal of oxide 32 on top of the silicon fin. Nitride liner 37 is optional in that it can be avoided if a selective oxide etch process highly selective to silicon is used, so that fin 30 is not significantly attacked. In this case, the oxide on top of the fin is removed and there will be epitaxial silicon growth.

Figure 3C:
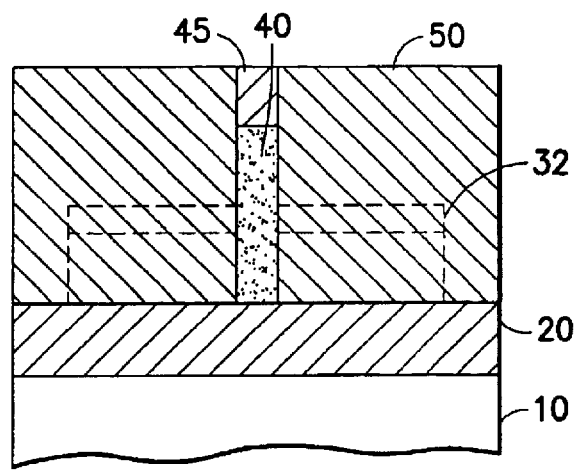
FIG. 3C shows the oxide planarized to the level of the gate cap.

An oxide 50 is deposited and planarized to the level of nitride 45. FIG. 3C shows layer 50 at the top of nitride 45 and covering the top and sides of the fin 30.

Gate nitride cap 45 is the remaining nitride from the nitride hardmask on top of the polysilicon gate 40. The result is shown in FIG. 3, with the oxide 50 filling the area up to the level of the top of the nitride 45 in FIG. 3C.

An optional process would do a lithography step at this time to structure the source/drain areas (as shown in FIG. 8) and then continue with the process described below in FIG. 4. In that case, the steps in FIG. 7 would not be required. The structural difference of applying the lithography step at this point compared to a later point in the process is that a nitride spacer 65 that is formed later in the process (FIG. 6) would not only be formed at the gate but also around the source/drain area. A disadvantage of this approach is that the nitride space, acting as a mask, will leave some free standing oxide fins around the source/drain area after the oxide etch that clears the fin sidewalls. The oxide fins generate some topography, but can be planarized later in the process).

The preferred process illustrated herein performs the lithography step in FIG. 8.

Figure 4A:
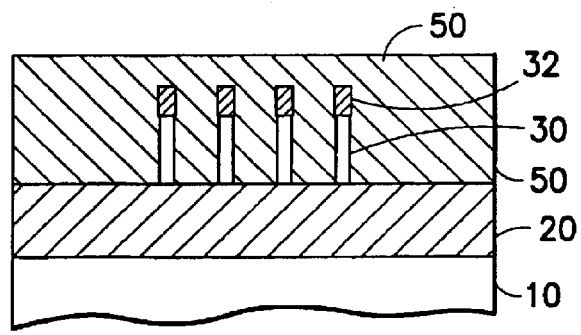
FIGS. 4A and 4C show the corresponding area to FIG. 3A and 3C after recess of the oxide.
Figure 4B:
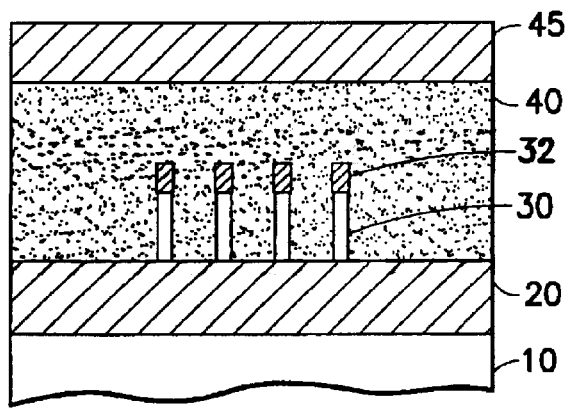
FIG. 4B is unchanged.
Figure 4C:
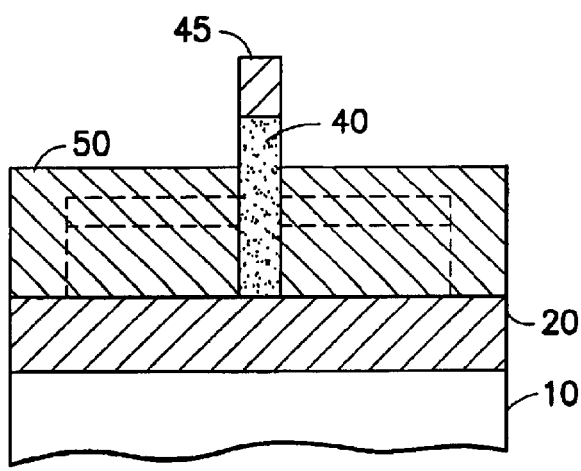

The oxide 50 in FIG. 3 is then recessed selective to nitride and silicon to a level above the oxide 32 of the silicon fin using wet or dry etch techniques with gate 40 projecting above the remaining oxide 50 (FIG. 4C). By covering the fins in the S/D area, as shown in FIG. 4B and 4A, it is possible to form a material layer 60 (see FIG. 5C) selectively over the gate, to function as a hardmask to define a protective oxide spacer over the gate.

Figure 5A:
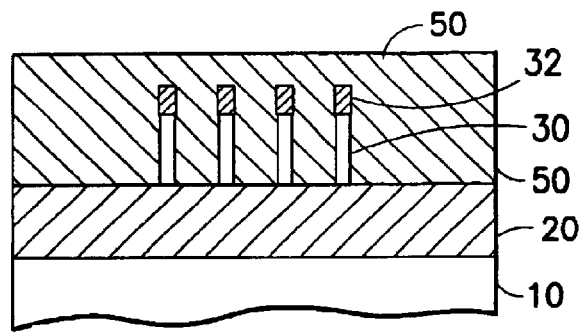
FIG. 5A–5C show the previous figures after the deposition of a conformal liner.
Figure 5B:
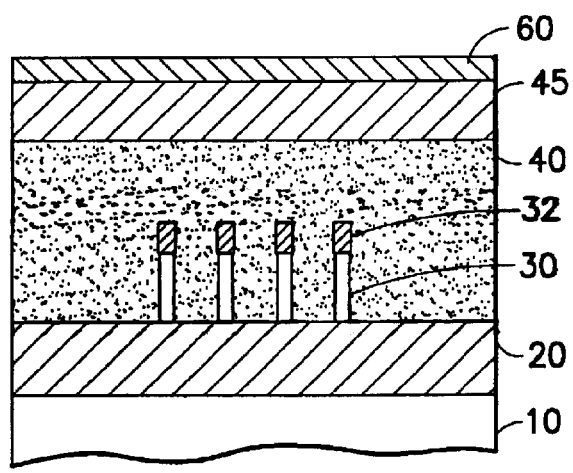
Figure 5C:
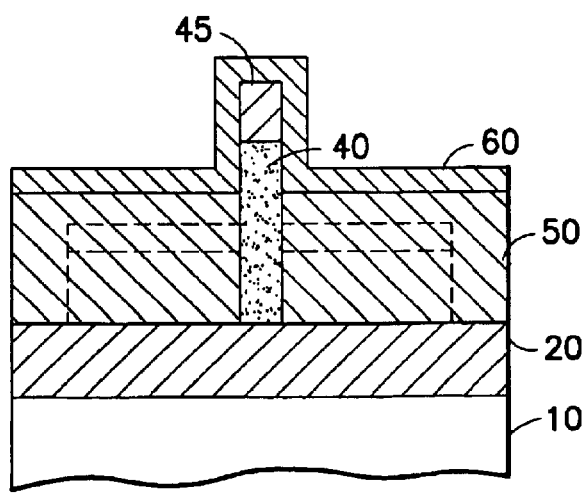

As shown in FIG. 5, a conformal layer 60 (Thickness 300 Å, Preferred range 30 Å–1000 Å) is deposited on top of the oxide and the projecting gate structure. The material of the layer is chosen such that the oxide underneath can be anisotropically etched selective to the layer material. Possible material choices are nitride, silicon (amorphous, polycrystalline) or silicon germanium. In the preferred embodiment illustrated, we chose nitride 60 for the layer.

Figure 6A:
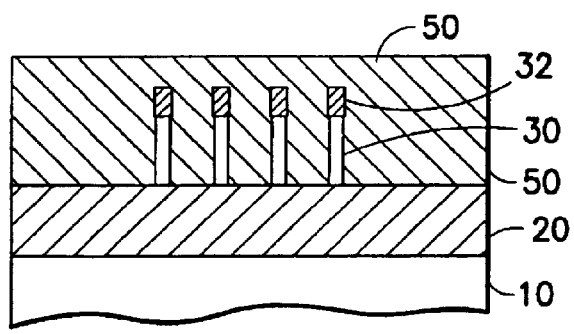
FIG. 6A–6C show the result of converting the conformal liner to gate spacers.
Figure 6B:
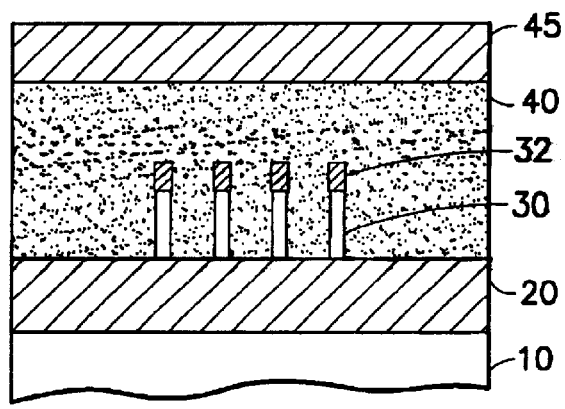
Figure 6C:
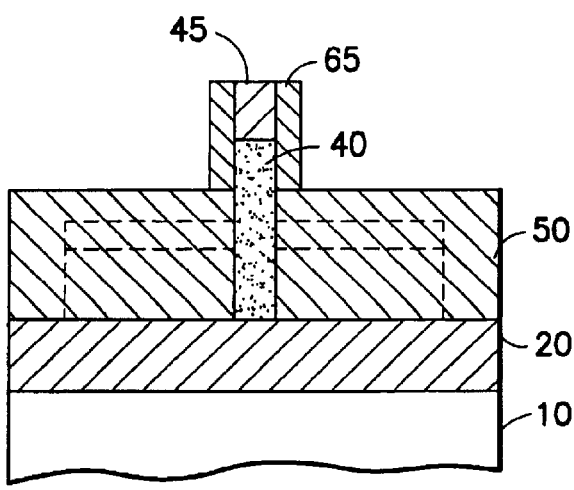

FIG. 6C, a nitride spacer 65 is formed by anisotropically etching the nitride layer 60. FIGS. 6A and 6B remain unchanged, showing that nitride 60 is not present in those areas.

Figure 7A:
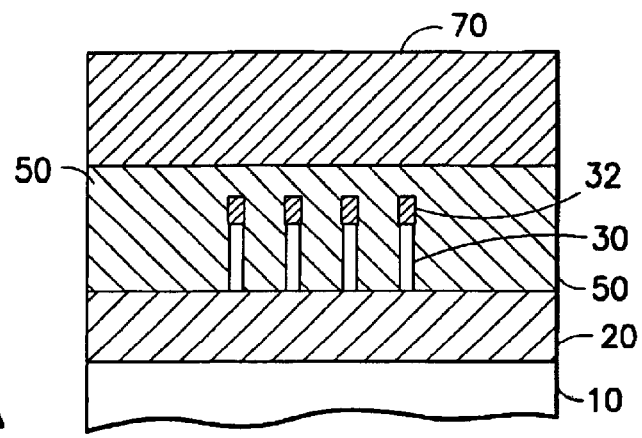
FIG. 7A–7C show a second oxide fill and planarization.
Figure 7B:
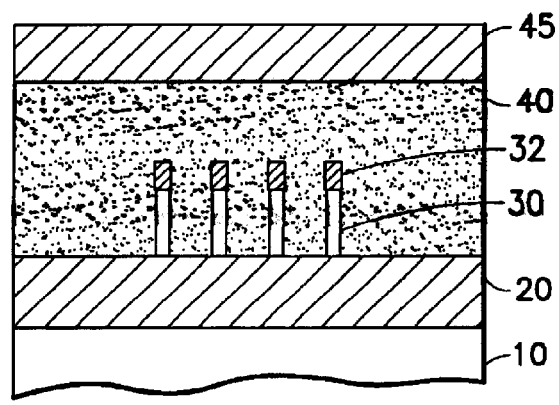
Figure 7C:
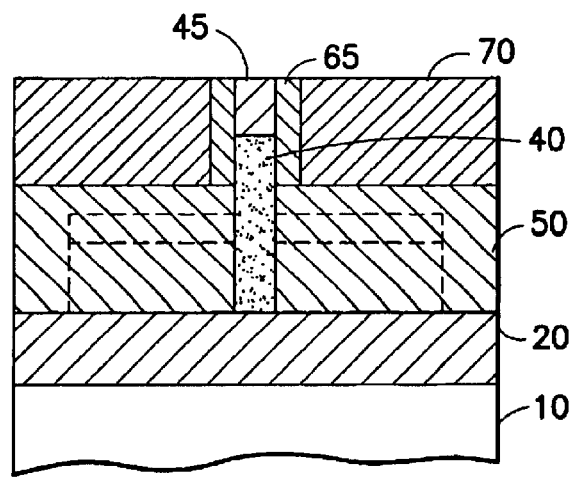

FIG. 7 shows the FinFET structure after CVD oxide 70 deposition and planarization of the oxide down to the nitride cap (45 and 65 in FIGS. 7B–C) on top of the gate poly 40 using CMP or any other planarization and etch back techniques. The purpose of this oxide deposition is the establishment of a common thickness of oxide to be etched, thus promoting uniformity and increasing the lithographic process window. These steps would be avoided if the lithography step described in the next paragraph and shown in FIG. 8D is applied earlier (e.g. before FIG. 4).

Figure 8A:
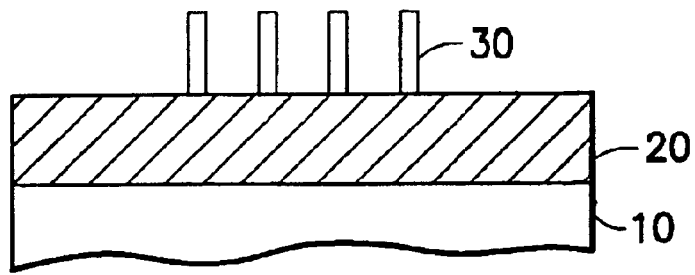
FIGS. 8A–8D show the result of etching the oxide to expose the fins in the S/D area and encapsulate the gate.
Figure 8B:
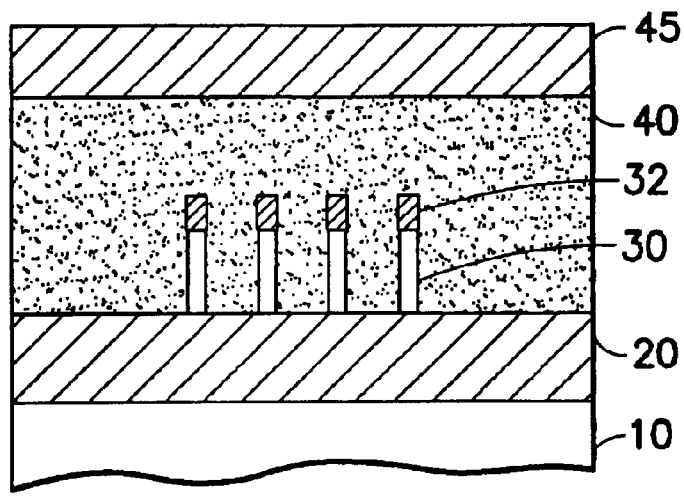
Figure 8C:
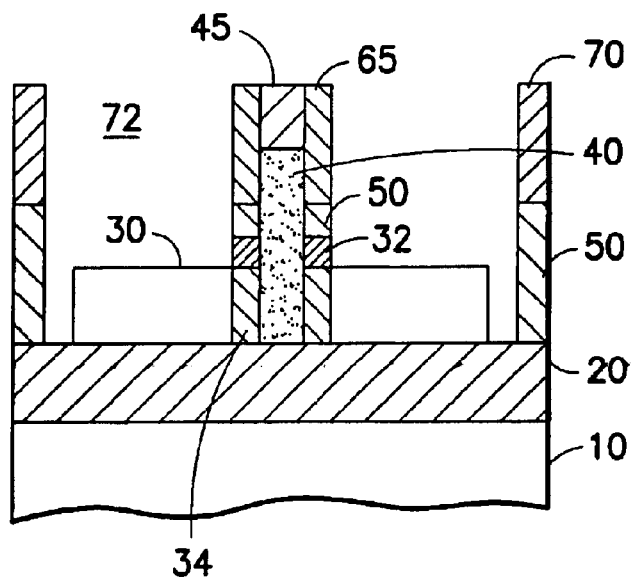
Figure 8D:
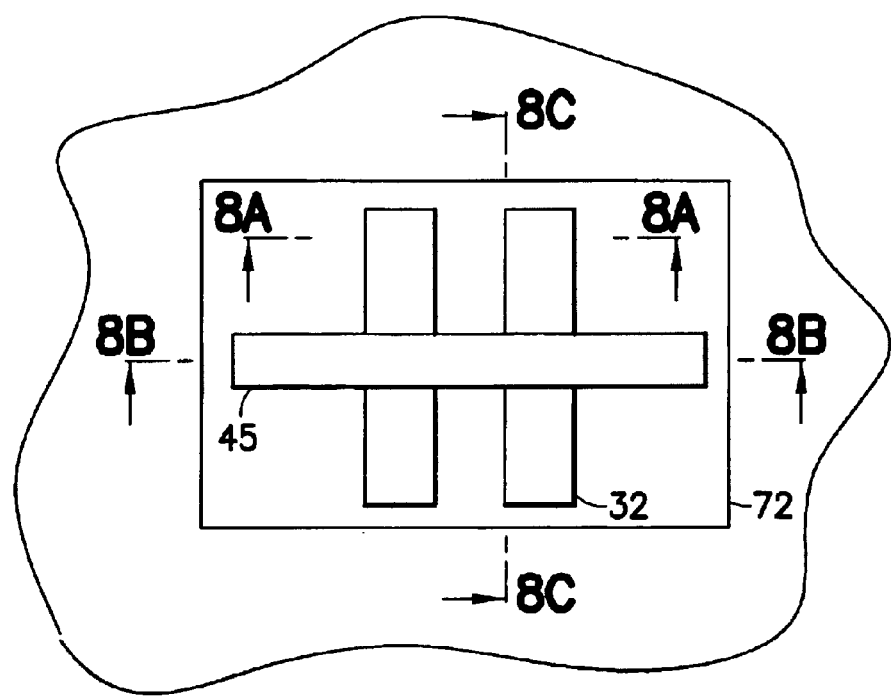

Referring to FIG. 8, a lithography process is then applied to structure the area for source/drain formation by opening an aperture 72 (FIG. 8C) in the enclosing oxide 70 followed by an anisotropic, nitride selective oxide etch stopping on the bottom of the silicon fins to clear the sidewalls of the fins (FIG. 8A). This process will result in some overetch into the BOX 20. If the optional nitride 37 in FIG. 3A is deposited, the etch will stop on top of the nitride at the bottom of fins 30 (i.e. on the top of BOX 20). The nitride spacers 65 are used as a mask to structure composite oxide spacers on both sides of the gate 40, formed from oxide layers 50, 32 and 34 (FIG. 8C). If the lithography step producing aperture 72 in FIG. 8 was processed earlier, the same oxide etch is applied, for a shorter time as less oxide has to be removed.

If the lithography step is done earlier, oxide 50 will be still present and the oxide etch is done the same way, just with the mask in place, meaning that only part of the oxide is etched, so that the nitride spacer can be formed in the same way. Outside of aperture 72, the oxide will be as high as the gate after the first oxide etch (FIG. 4).

Figure 9A:
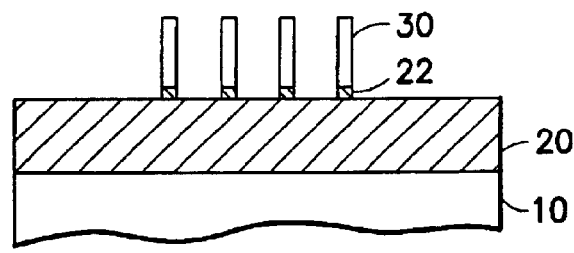
FIGS. 9A, 9B and 9C show cross sections at the end and middle of the fins after stripping the nitride.
Figure 9B:
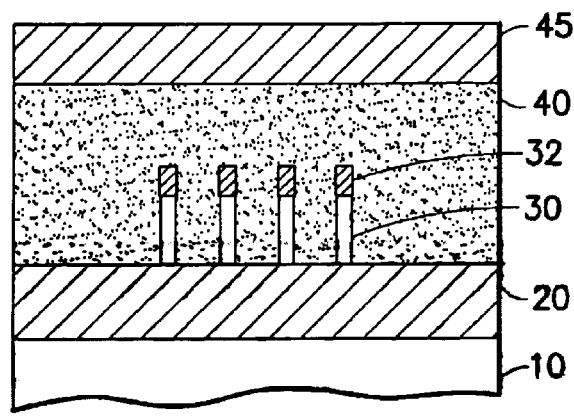
Figure 9C:
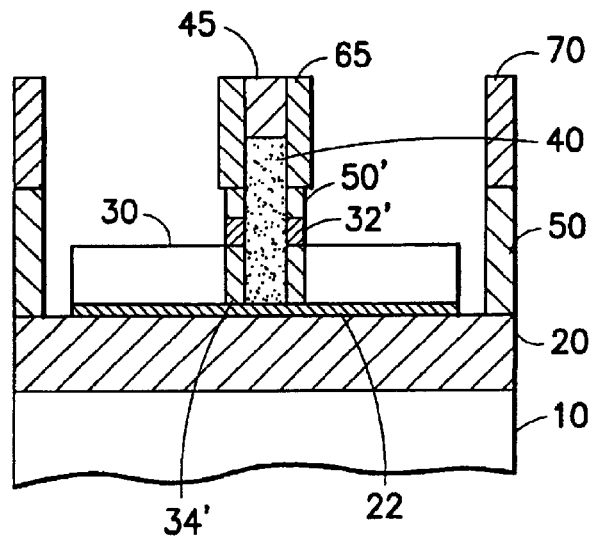

If different spacer thicknesses for NFETs and PFETs are required, the oxide spacers (50, 32, 34) can be trimmed to (50", 32', 34') using isotropic, wet, vapor or plasma etch processes after masking the areas where thicker spacers are desired, FIG. 9. The masking can be done using photo resist. If the optional nitride liner 37 described in FIG. 3 was used it is removed at this point using a wet etch process, e.g. hot phosphoric acid. In addition, the oxide (gate ox/gate reox) has to be removed before the epitaxial step.

Figure 10A:
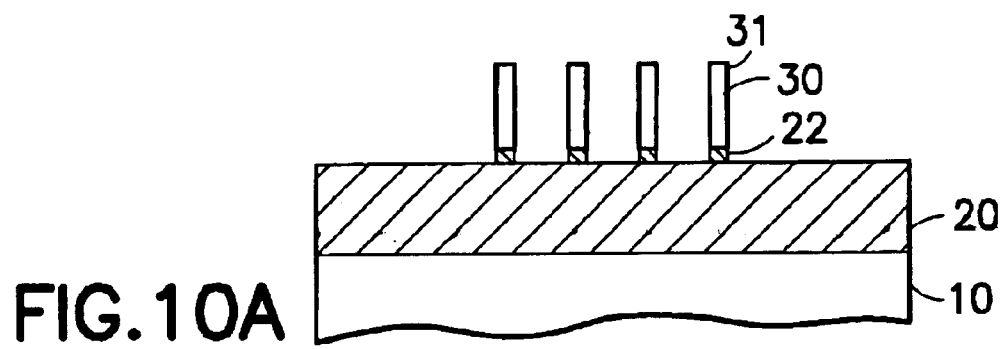
FIGS. 10A and 10B show cross sections at the end and middle of the fins after epitaxial deposition of additional silicon on the fins in the S/D area.
Figure 10B:
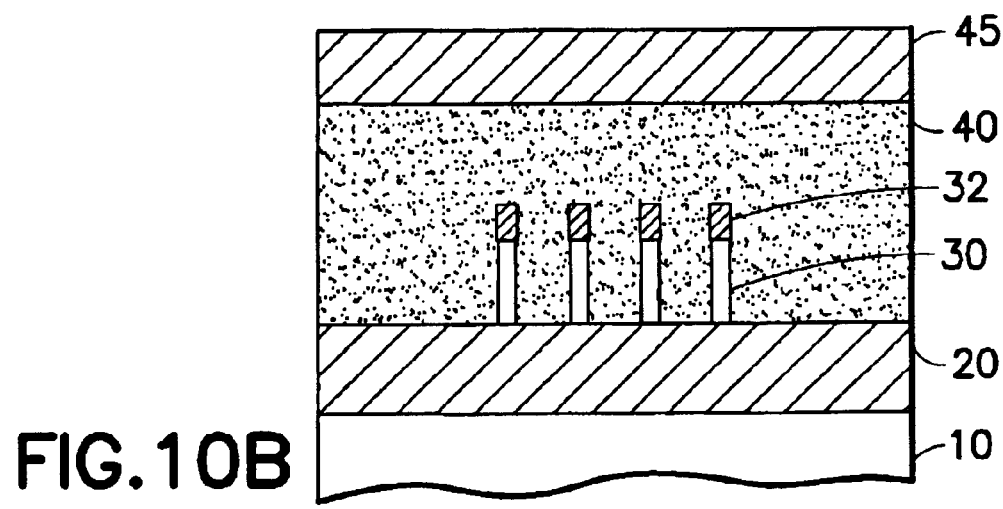

FIG. 10A shows the result of the selective epitaxial growth step to thicken the fins 30 in the S/D area, thereby lowering the series resistance during operation. The epitaxial step was performed while the gates are encapsulated by the composite spacers, so that the thickness of fins 30 in FIG. 10B (which is the thickness of the FinFET body) does not increase. If different thicknesses of the gate spacer are required for NFETs and PFETs, different spacers thicknesses have to be created before the epitaxial step. Thickness of the gate spaces is et such that they cover areas of the fin that contain the conventional halo and extension implants, well known to those skilled in the art, thereby preventing interference with those implants during the doping and subsequent annealing of the S/D.

At this point the process can be continued according to the SARC2 process known to those skilled in the art. This process can also be applied to a process flow in which the source/drain areas are lithographically defined before the silicon fin etch, as described by Choi et al., IEDM 201, p. 421–424.

In summary, the outline of the preferred process flow is:

Form fins to a width that will be the body of the transistor.

Form a poly gate intersecting the fins in the transistor body.

Cover the fins with oxide.

Form a conformal cap over the projecting gate material (above the oxide covering the fins).

Etch oxide down to BOX, thereby forming a gate cover, and overetch until silicon in S/D area of fins is exposed.

Thicken the fins while the gate is covered by the gate cover.

In more detail, the process flow is:

Form fins to a width that will be the body of the transistor.

Form a poly gate 40 intersecting the fins in the transistor body.

Deposit, planarize and pre-dope gate poly, deposit oxide 42, nitride cap 45, oxide cap 46; define hardmask area (optional resist trim, nitride trim); etch gate stack, remove oxide 46.

Oxidize gate, deposit oxide liner; halo and extension implants; nitride liner 37.

Cover the fins with fill oxide 50, planarize to gate cap.

Recess oxide 50 to a level above fins and below gate cap.

Form a conformal cap over the projecting gate material (above the oxide covering the fins).

Aniostropic cap etch, forming gate sidewalls down to filler oxide.

Oxide deposition and planarization to improve lithographic process window, if lithographic process window is big enough then these steps are not necessary either.

Lithography, opening window over fins, gate.

Etch filler oxide down to BOX, thereby forming a gate cover (nitride on top, oxide on bottom), and overetch until silicon in S/D area of fins is exposed.

Thicken the fins while the gate is covered by the gate cover.

An alternative process flow that has the advantage of saving one oxide deposition and one oxide planarization step and the disadvantage of leaving some oxide fins that generate topography but can be planarized with a standard (not additional) oxide planarization step later in the process is:

Form fins to a width that will be the body of the transistor.

Form a poly gate 40 intersecting the fins in the transistor body. Deposit, planarize, pre-dope poly, deposit oxide 42, nitride cap 45, oxide cap 46; define hardmask area (optional resist trim, nitride trim); etch gate stack, remove oxide 46.

Oxidize gate, deposit oxide linear; halo and extension implants; nitride liner 37.

Cover the fins with filler oxide 50, planarize to gate cap.

Lithography, opening window over fins, gate.

Recess oxide 50 to a level above fins and below gate cap).

Form a conformal cap over the gates and fins.

Anisotropic cap etch, as in previous process sequence.

Oxide etch down to BOX or, if used, nitride liner.

Thicken the fins while the gate is covered by the gate cover.

Each of the described processes then continues with a standard FinFET process such as that described in J. Kedzierski et al., IEEE Transactions on Electron Devices v.50 n.4 April 2003 p.952–958, or any other convenient method of performing standard back end processing, well known to the art.

While the invention has been described in terms of a single preferred embodiment, those skilled in the art will recognized that the invention can be practiced in various versions within the spirit and scope of the following claims.

What is claimed is:

1. A method of forming a FinFET comprising the steps of:
   forming a set of fins having a fin height and a fin thickness on a silicon substrate;
   forming a gate, having a gate height greater than said fin height and intersecting said fin in a body area and separated therefrom by a gate insulator;
   depositing a first temporary material up to a first level above the top of said fin and below said gate height;
   forming a conformal layer over said gate;
   using said conformal layer as a hardmask, etching said temporary material, thereby forming a composite gate cover over said gate and exposing sides of said fins; and
   increasing said fin thickness while said gate is isolated from said set of fins by said gate cover.

2. A method according to claim 1, in which said fins are formed from silicon, said first temporary material is oxide and said conformal layer is nitride, whereby said composite layer comprises oxide in a lower portion and nitride in an upper portion.

3. A method according to claim 2, further comprising a step of etching said oxide in said lower portion with a method selective to nitride, thereby reducing a thickness of said oxide in said lower portion.

4. A method according to claim 3, in which said oxide in said lower portion is reduced to a first thickness in N-type FinFETs and to a second thickness of P-type FinFETs.

5. A method according to claim 1, in which said step of increasing said fin thickness is performed by epitaxial growth on poly fins.

6. A method according to claim 5, in which said fins are formed from silicon, said first temporary material is oxide and said conformal layer is nitride, whereby said composite layer comprises oxide in a lower portion and nitride in an upper portion.

7. A method according to claim 6, further comprising a step of etching said oxide in said lower portion with a method selective to nitride, thereby reducing a thickness of said oxide in said lower portion.

8. A method according to claim 7, in which said oxide in said lower portion is reduced to a first thickness in N-type FinFETs and to a second thickness in P-type FinFETs.

9. A method according to claim 1, in which said silicon substrate is a SOI substrate having a device layer of silicon above a layer of buried insulator and said fins are formed in said device layer.

10. A method according to claim 9, in which said fins are formed from silicon, said first temporary material is oxide and said conformal layer is nitride, whereby said composite layer comprises oxide in a lower portion and nitride in an upper portion.

11. A method according to claim 10, further comprising a step of etching said oxide in said lower portion with a method selective to nitride, thereby reducing a thickness of said oxide in said lower portion.

12. A method according to claim 11, in which said oxide in said lower portion is reduced to a first thickness in N-type FinFETs and to a second thickness in P-type FinFETs.

13. A method of forming a FinFET comprising the steps of:
   forming a set of fins having a fin height and a fin thickness on a silicon substrate;
   forming a gate, having a gate height greater than said fin height and intersecting said fin in a body area and separated therefrom by a gate insulator;
   depositing a first temporary material up to a first level at said gate height;
   recessing said temporary material to a height below said gate height and above said fins;
   forming a conformal cap over said gates and fins:

using said conformal cap as a hardmask, etching said temporary material, thereby exposing said fins; and increasing said fin thickness while said gate is isolated from said set of fins by said cap.

14. A method according to claim 13, in which said fins are formed from silicon, said first temporary material is oxide and said conformal layer is nitride, whereby said composite layer comprises oxide in a lower portion and nitride in an upper portion.

15. A method according to claims 14, further comprising a step of etching said oxide in said lower portion with a method selective to nitride, thereby reducing a thickness of said oxide in said lower portion.

16. A method according to claim 15, in which said oxide in said lower portion is reduced to a first thickness in N-type FinFETs and to a second thickness of P-type FinFETs.

17. A method according to claim 13, in which said step of increasing said fin thickness is performed by epitaxial growth on poly fins.

18. A method according to claim 17, in which said fins are formed from silicon, said first temporary material is oxide and said conformal layer is nitride, whereby said composite layer comprises oxide in a lower portion and nitride in an upper portion.

19. A method according to claim 18, further comprising a step of etching said oxide in said lower portion with a method selective to nitride, thereby reducing a thickness of said oxide in said lower portion.

20. A method according to claim 19, in which said oxide in said lower portion is reduced to a first thickness in N-type FinFETs and to a second thickness in P-type FinFETs.

21. A method according to claim 13, in which said silicon substrate is a SOI substrate having a device layer of silicon above a layer of buried insulator and said fins are formed in said device layer.

22. A method according to claim 21, in which said fins are formed from silicon, said first temporary material is oxide and said conformal layer is nitride, whereby said composite layer comprises oxide in a lower portion and nitride in an upper portion.

23. A method according to claim 22, further comprising a step of etching said oxide in said lower portion with a method selective to nitride, thereby reducing a thickness of said oxide in said lower portion.

24. A method according to claim 23, in which said oxide in said lower portion is reduced to a first thickness in N-type FinFETs and to a second thickness in P-type FinFETs.

* * * * *